US006839646B2

(12) United States Patent
Ishii (10) Patent No.: US 6,839,646 B2
(45) Date of Patent: Jan. 4, 2005

(54) ELECTRON BEAM TEST SYSTEM AND ELECTRON BEAM TEST METHOD

(75) Inventor: Tatsuya Ishii, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 59 days.

(21) Appl. No.: 10/280,018

(22) Filed: Oct. 25, 2002

(65) Prior Publication Data

US 2003/0088379 A1 May 8, 2003

(30) Foreign Application Priority Data

Nov. 7, 2001 (JP) ........................................ 2001-342200

(51) Int. Cl.$^7$ ...................... G01R 27/28; G01R 31/305; G01N 23/00
(52) U.S. Cl. ........................ 702/117; 324/751; 250/310
(58) Field of Search .......................... 702/117; 324/750, 324/751, 765; 250/310, 311

(56) References Cited

U.S. PATENT DOCUMENTS 5,995,647 A * 11/1999 Hamada ..................... 382/145
6,459,282 B1 * 10/2002 Nakamura .................. 324/750
6,479,983 B1 * 11/2002 Ebiya ...................... 324/158.1

FOREIGN PATENT DOCUMENTS

| JP | 61-035367 | 2/1986 |
| JP | 3-254053 | 11/1991 |
| JP | 7-092238 | 4/1995 |
| JP | 8-184651 | 7/1996 |
| JP | 9-026464 | 1/1997 |
| JP | 9-033616 | 2/1997 |
| JP | 11-242071 | 9/1999 |

OTHER PUBLICATIONS

U.S. patent application Ser. No. 10/226,140, Ishii, filed Aug. 23, 2002.
Ishii et al., "Study of Electron–Beam Probe for LSI Process Failure Analysis", Technical Report of IEICE R2001–31, SSS2001–26(2001–12), pp. 13–20, Nov. 8, 2001. (w/abstract).

* cited by examiner

Primary Examiner—John Barlow
Assistant Examiner—Meagan S Walling
(74) Attorney, Agent, or Firm—Oliff & Berridge, PLC (57) ABSTRACT

An electron beam test system which can determine whether a potential is high or low for a DC signal or a signal having no potential change before the time of observation. The electron beam test system obtains potential contrast data for analysis by irradiating electron beam to a semiconductor integrated circuit device which is an analysis object. This system has a tester which supplies a test pattern signal for analysis to the semiconductor integrated circuit device and holds the supplied test pattern signal at a given time; an electron gun which irradiates electron beam to the semiconductor integrated circuit device in response to the hold; and a detector which detects the potential contrast data of the semiconductor integrated circuit device which is irradiated with electron beam.

37 Claims, 8 Drawing Sheets

PERCENTAGE OF IMAGE INFORMATION STORED
IN FRAME MEMORY FOR EACH TIME PERIOD

ELECTRON BEAM TEST SYSTEM AND ELECTRON BEAM TEST METHOD

Japanese Patent Application No. 2001-342200, filed on Nov. 07, 2001, is herein incorporated by reference in its entirety.

BACKGROUND OF THE INVENTION

The present invention relates to an electron beam test system and an electron beam test method, and particularly relates to an electron beam test system and an electron beam test method able to determine whether a potential is high or low about a signal such as a DC signal or a signal having no potential change before the time of observation.

Figure 4:
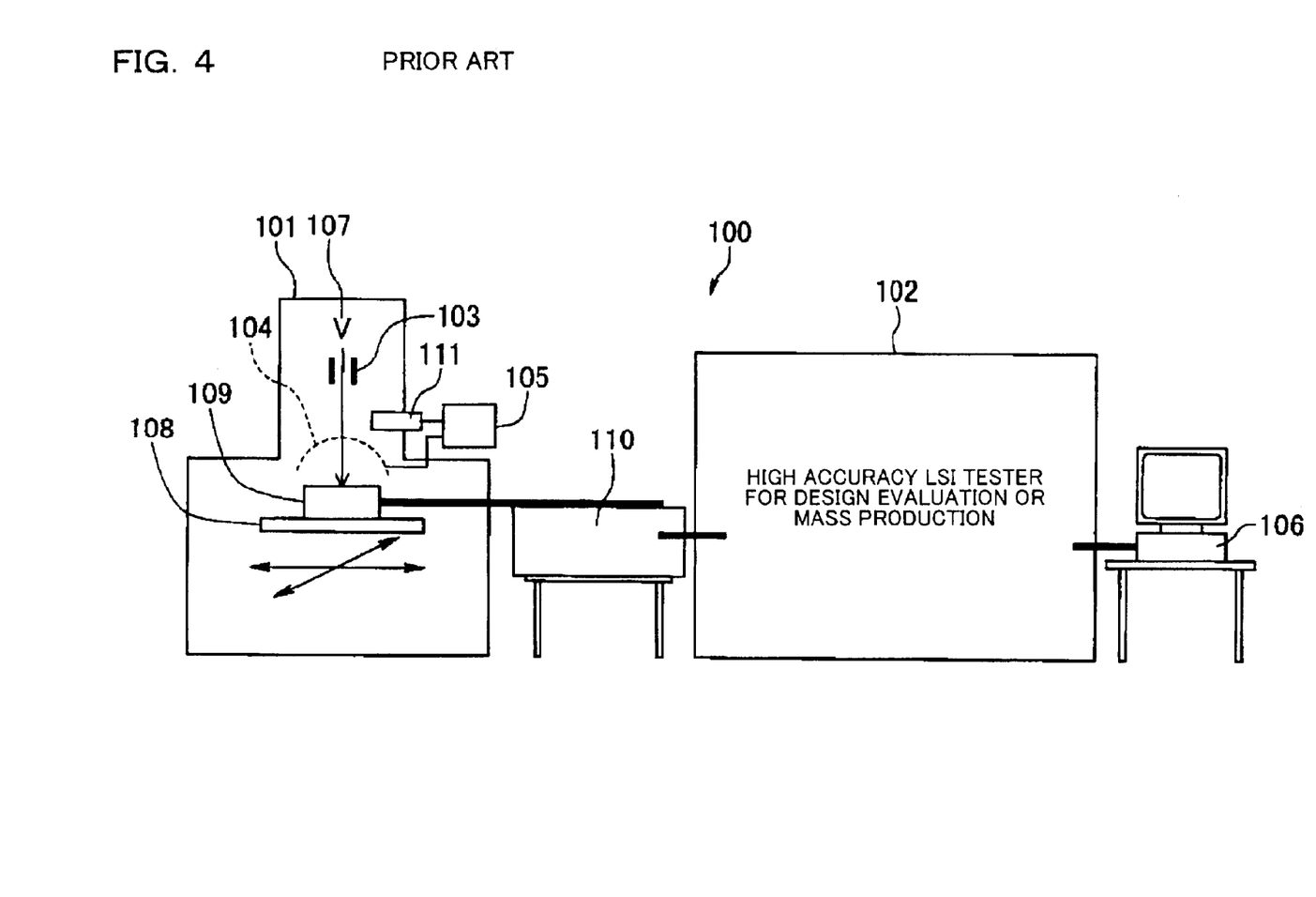
FIG. 4 shows a conventional electron beam test system.

FIG. 4 shows a conventional electron beam test system.

The electron beam test system 100 has an electron beam prober 101, a high accuracy LSI tester 102 for operating a device connected to this electron beam prober 101, a control engineering work station (EWS) 106 for controlling operations of the electron beam prober 101 and the high accuracy LSI tester 102.

The electron beam prober 101 has a structure constructed such that a beam blanker 103 for forming a pulse beam, an analytical grid 104 for observing potential distribution and measuring a waveform, and a waveform measuring unit 105 connected to this analytical grid 104 are added to a SEM (scanning electron microscopy). A fixed stage 109 for placing a semiconductor wafer is arranged on an X-Y movable stage 108.

A non-defective or defective semiconductor wafer (semiconductor integrated circuit device) is placed on the fixed stage 109.

This semiconductor wafer is connected to a test head 110, and is operated by this test head 110. Concretely, a predetermined test pattern signal including a clock signal is inputted from the test head 110 to each input terminal of the semiconductor wafer.

The operated semiconductor wafer is irradiated with electron beam by a field emission gun (FE-Gun) 107 through the beam blanker 103.

A secondary electron from the semiconductor wafer is detected by a secondary electron detector 111 through the analytical grid 104, and a voltage waveform of the operated semiconductor wafer, etc. are measured by the waveform measuring unit 105.

Figure 5:
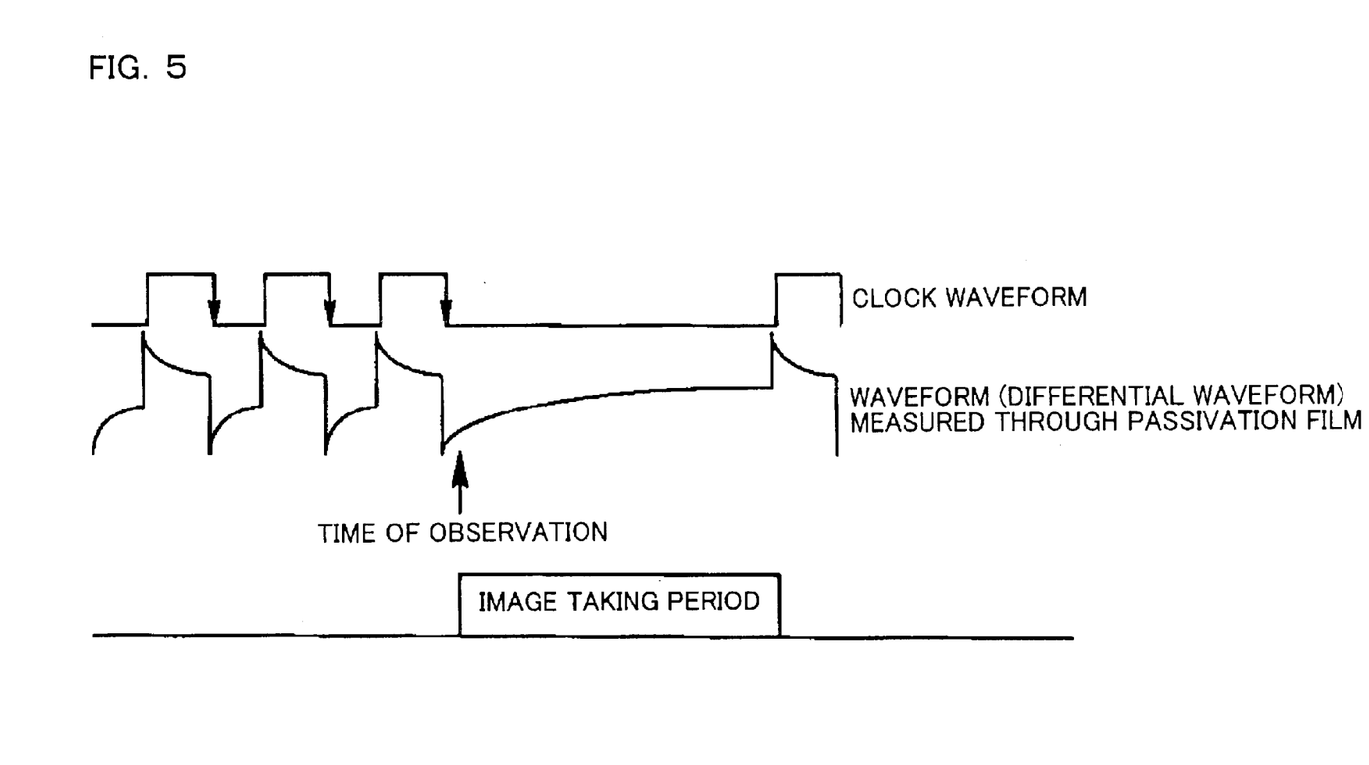
FIG. 5 shows an example of the clock signal waveform of wiring and the differential waveform measured through a passivation film.

FIG. 5 shows one example of the test pattern signal supplied to the semiconductor wafer and its measured waveform. Here, one example of a clock signal waveform of wiring of the semiconductor wafer and a differential waveform through a passivation film is shown.

As shown in this figure, the differential waveform is detected through a passivation film in the voltage waveform measurement in the electron beam test system. When a desired test pattern signal is supplied to the semiconductor wafer, a clock period is lengthened and a potential contrast image is obtained.

In the above conventional electron beam test system, the image of a low potential becomes light and the image of a high potential becomes dark in a pulse signal such as a clock signal. Accordingly, the observation can be made similarly to a state having no passivation film even when no passivation film is separated.

However, in the conventional technique, the image becomes gray (intermediate color) with respect to a direct current (DC) signal or a signal having no potential change before the time of observation. Therefore, no high/low potentials can be judged so that it is difficult to recognize the potential.

Further, in the conventional technique, potential contrast is detected every time a desired test pattern signal is inputted while the test pattern signal is looped. In this case, a plurality of shots are required to detect the potential contrast every time the test pattern is looped. The obtained potential contrast data is then integrated, and a final potential contrast image is generated.

Accordingly, in the conventional technique, it takes time to generate a potential contrast image, so that fault or breakdown caused by process defect cannot be rapidly analyzed.

In addition, in such a conventional technique, a defective phenomenon having no repeatability can not be observed.

BRIEF SUMMARY OF THE INVENTION

The present invention is devised in the light of the above problems and may provide an electron beam test system and an electron beam test method able to obtain potential information of a semiconductor integrated circuit device by one-time observation, and to determine whether a potential is high or low about a DC signal or a signal having no potential change before the time of observation.

(1) According to a first aspect of the present invention, there is provided an electron beam test system which obtains potential contrast data for analysis by irradiating electron beam to a semiconductor integrated circuit device which is an analysis object.

The electron beam test system comprises:

a tester which supplies a test pattern signal for analysis to the semiconductor integrated circuit device, and holds the supplied test pattern signal at a given time;

an electron gun which irradiates electron beam to the semiconductor integrated circuit device in response to the hold of the test pattern signal; and a detector which detects the potential contrast data of the semiconductor integrated circuit device which is irradiated with electron beam.

In this electron beam test system, the test pattern signal supplied to the semiconductor integrated circuit device is held when a desired test pattern signal is supplied.

In response to the hold of the test pattern signal (simultaneously with the start of the hold or after the hold, for example), this semiconductor integrated circuit device is irradiated with the electron beam, and the potential contrast data of this semiconductor integrated circuit device is detected. Thus, a change in potential within the semiconductor integrated circuit device can be detected.

Namely, the semiconductor integrated circuit device is irradiated with electron beam not when the test pattern signal for analysis is being supplied, but at the same time with or after the hold of the test pattern signal. This means that the charge to a surface of the semiconductor integrated circuit device is done simultaneously with or after the hold. Thus a DC signal or a signal having no potential change before the time of observation can be detected as a charge waveform according to this method.

According to this aspect of the present invention, in response to the electron beam irradiation to the semiconductor integrated circuit device having a test pattern signal which is held, the potential contrast of the semiconductor integrated circuit device is detected, and thus whether a potential is high or low can be determined for a DC signal or a signal having no potential change before the time of observation.

In addition, in accordance with this aspect of the present invention, the potential of a signal line can be detected as a charging waveform signal through a passivation film. Therefore, the generation of a preferable potential contrast image can be implemented by one-time observation (or observation of a single phenomenon) without looping the test pattern signal. Namely, since a potential contrast image can be generated by observation of a single phenomenon that is a charging waveform, it is possible to implement a system which can simply obtain potential information in a single shot through a passivation film of a semiconductor integrated circuit device.

(2) The electron beam test system may further comprise:

an analytical grid for observing potential distribution, disposed between the electron gun and the semiconductor integrated circuit device.

(3) The electron beam test system may further comprise:

a horizontally movable stage on which is mounted the semiconductor integrated circuit device which is an analysis object.

(4) According to a second aspect of the present invention, there is provided an electron beam test system which obtains potential contrast data for analysis by irradiating electron beam to a semiconductor integrated circuit device which is an analysis object, the electron beam test system comprising:

a first stage on which is mounted the semiconductor integrated circuit device which is an analysis object;

a second stage on which is mounted a non-defective semiconductor integrated circuit device for comparison with the semiconductor integrated circuit device which is an analysis object;

a tester which supplies a test pattern signal for analysis to the semiconductor integrated circuit device which is an analysis object and the non-defective semiconductor integrated circuit device, and holds the supplied test pattern signal at a given time for each of the semiconductor integrated circuit device which is an analysis object and the non-defective semiconductor integrated circuit device;

a first electron gun which irradiates electron beam to the semiconductor integrated circuit device which is an analysis object in response to the hold of the test pattern signal supplied to the semiconductor integrated circuit device which is an analysis object;

a second electron gun which irradiates electron beam to the non-defective semiconductor integrated circuit device in response to the hold of the test pattern signal supplied to the non-defective semiconductor integrated circuit device;

a first detector which detects the potential contrast data of the semiconductor integrated circuit device as an analysis object which is irradiated with electron beam; and a second detector which detects the potential contrast data of the non-defective semiconductor integrated circuit device which is irradiated with electron beam.

In accordance with this electron beam test system, the potential contrast data of the semiconductor integrated circuit device which is an analysis object can be compared with the potential contrast data of the non-defective semiconductor integrated circuit device. Thus, analysis time can be greatly shortened.

(5) The electron beam test system may further comprise:

a first analytical grid for observing potential distribution, disposed between the first electron gun and the first stage; and a second analytical grid for observing potential distribution, disposed between the second electron gun and the second stage.

(6) According to a third aspect of the present invention, there is provided an electron beam test system which obtains potential contrast data by irradiating electron beam to a semiconductor integrated circuit device which is an analysis object, wherein:

a test pattern signal supplied to the semiconductor integrated circuit device is held at a given time;

electron beam irradiation to the semiconductor integrated circuit device is started at the same time with or after the hold of the test pattern signal; and the potential contrast data of the semiconductor integrated circuit device which is irradiated with electron beam is detected.

(7) According to a fourth aspect of the present invention, there is provided an electron beam test system which obtains potential contrast data from a semiconductor integrated circuit device which is an analysis object and a non-defective semiconductor integrated circuit device for comparison with the semiconductor integrated circuit device which is an analysis object, by irradiating electron beam to the semiconductor integrated circuit device which is an analysis object and the non-defective semiconductor integrated circuit device, wherein:

a test pattern signal supplied to each of the semiconductor integrated circuit device which is an analysis object and the non-defective semiconductor integrated circuit device is held at a given time;

electron beam irradiation to each of the semiconductor integrated circuit device which is an analysis object and the non-defective semiconductor integrated circuit device is started at the same time with or after the hold of the test pattern signal; and the potential contrast data of each of the semiconductor integrated circuit device which is an analysis object and the non-defective semiconductor integrated circuit device which is irradiated with electron beam is detected.

(8) The electron beam test system may further comprise:

a beam control section which performs the electron beam irradiation as frame scan irradiation to the semiconductor integrated circuit device, at the same time with or after the hold of the supplied test pattern signal.

The potential contrast data of a surface of the semiconductor integrated circuit device can be more clearly obtained and a preferable potential contrast image can be generated, by synchronizing the frame scan for the electron beam with the frame scan for the potential contrast data detection.

(9) Frame scan for the electron beam irradiation may be performed in synchronization with frame scan for the potential contrast data detection.

Thus, change in potential observed through a passivation film simultaneously with the start of electron beam irradiation, or concretely, change in potential as a charging waveform can be reliably obtained as a potential contrast image by performing the frame scan for the potential contrast data detection in synchronization with the frame scan irradiation for electron beam.

(10) The potential contrast data detection may be sequentially performed two or more times in synchronization with the electron beam irradiation; and a potential contrast image may be generated by integrating the detected potential contrast data in accordance with a given rule.

A potential of a signal line can be detected as a large charging waveform signal through a passivation film, by irradiating electron beam to the semiconductor integrated circuit device having a test pattern signal which is held. Therefore, the potential contrast data detection may be sequentially performed two or more times in this charging period and a potential contrast image may be generated by integrating the detected potential contrast data in accordance with a given rule in the present invention. Thus, generation of a more preferable potential contrast image improving both in the strength of the potential contrast and an S/N ratio can be implemented by observation of a single phenomenon. Namely, since a potential contrast image can be generated by observation of a single phenomenon that is a charging waveform, it is possible to implement a system which can simply and more reliably obtain potential information of a semiconductor integrated circuit device in a single shot through a passivation film.

The potential contrast image may be generated by setting the integration ratio of the first detected potential contrast data to be greater than the integration ratio of the subsequently detected potential contrast data.

This makes it possible to optimize an image storage ratio in memory means (e.g., frame memory) for storing the potential contrast data obtained by a plurality of detections, and to generate a potential contrast image in which the potential contrast strength and the S/N ratio are further optimized.

(11) Start time of the electron beam irradiation and start time of the potential contrast data detection may be determined based on the start time of the hold of the supplied test pattern signal.

Determination of the start time of the electron beam irradiation and the start time of the potential contrast data detection is required only once by the above configuration. Even if the type of the semiconductor integrated circuit device as an analysis object is changed, or even if the supply timing of the test pattern signal is changed, it is not necessary to reset the start time of the electron beam irradiation and the start time of the potential contrast data detection so that the entire system can be more simply treated.

As an example of such configuration, a trigger signal may be generated in response to the hold of the supplied test pattern signal, and the start time of the electron beam irradiation and the start time of the potential contrast data detection may be determined based on the trigger signal.

(12) According to a fifth aspect of the present invention, there is provided an electron beam test method wherein:

a test pattern signal supplied to a semiconductor integrated circuit device which is an analysis object is held at the desired time;

the semiconductor integrated circuit device is irradiated with electron beam in response to the hold of the test pattern signal; and a potential contrast image used to analyze fault or breakdown caused by a process defect is generated by detecting potential contrast data of the semiconductor integrated circuit device which is irradiated with electron beam.

(13) According to a sixth aspect of the present invention, there is provided an electron beam test method wherein:

a test pattern signal supplied to each of a semiconductor integrated circuit device which is an analysis object and a non-defective semiconductor integrated circuit device is held at the desired time;

each of the semiconductor integrated circuit device which is an analysis object and the non-defective semiconductor integrated circuit device is irradiated with electron beam in response to the hold of the test pattern signal;

potential contrast images are generated by detecting potential contrast data of the semiconductor integrated circuit device and the non-defective semiconductor integrated circuit device which are irradiated with electron beam; and fault or breakdown caused by a process defect of the analysis object is analyzed by comparing the generated potential contrast images.

(14) In this method, the potential contrast data detection may be sequentially performed two or more times in synchronization with the electron beam irradiation, and a potential contrast image may be generated by integrating the detected potential contrast data in accordance with a given rule.

(15) In this method, frame scan for the electron beam irradiation may be performed in synchronization with frame scan for the potential contrast data detection.

(16) The analysis of the semiconductor integrated circuit device according to the present invention may be performed in a single semiconductor integrated circuit device, or a semiconductor wafer having a semiconductor integrated circuit device, or the both.

DETAILED DESCRIPTION OF THE EMBODIMENT

An embodiment of the present invention will be described below with reference to the drawings.

1. Entire System Configuration

Figure 1:
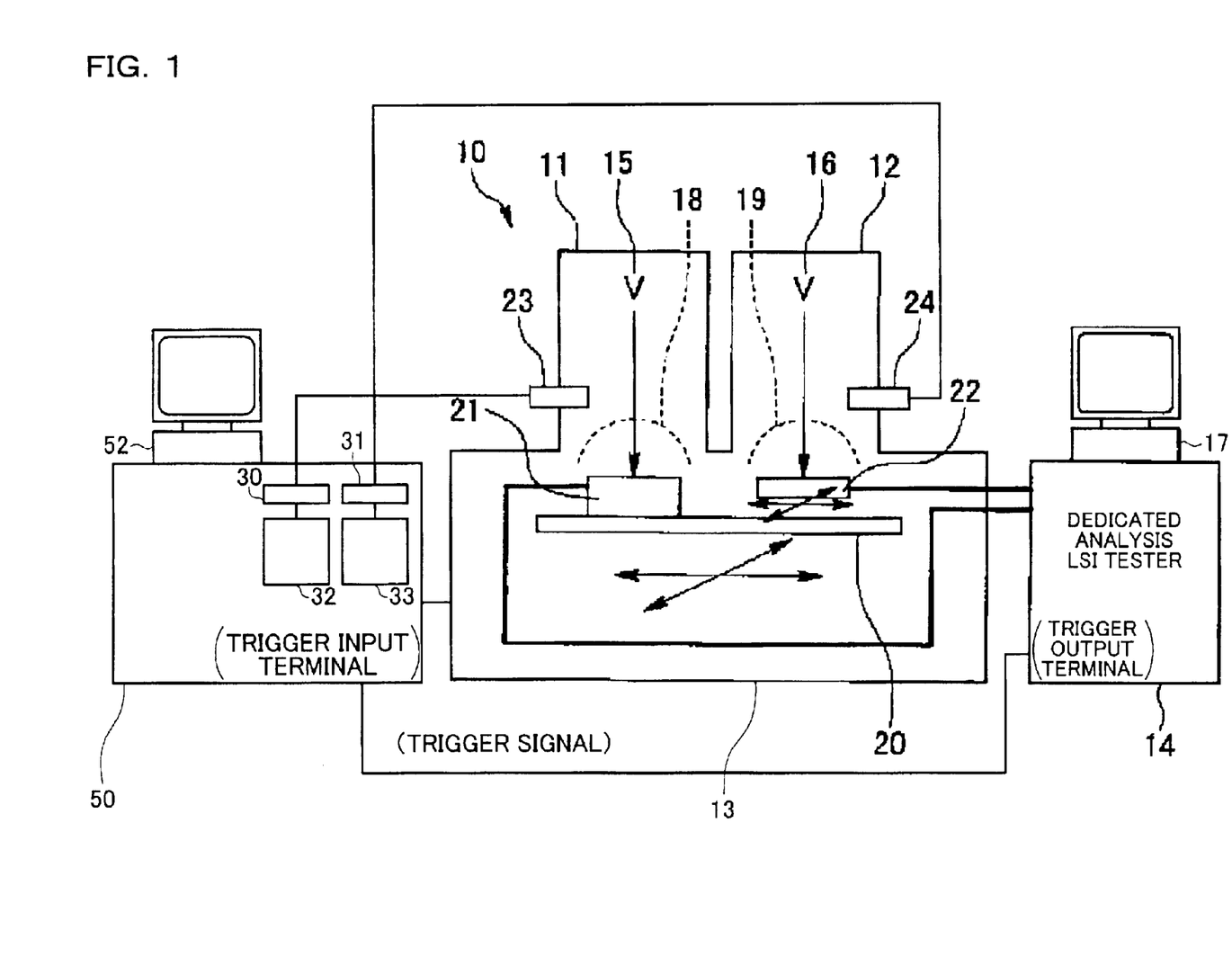
FIG. 1 is a diagram illustrating an electron beam test system according to one embodiment of the present invention.

FIG. 1 is a view showing a process electron beam test system in an embodiment of the present invention.

This process electron beam test system is a dedicated electron beam test system for analyzing fault and breakdown caused by a process defect in the semiconductor integrated circuit device of a CMOS static operation.

The system of this embodiment is formed such that this system can analyze the semiconductor integrated circuit device in a simplex state, and can also analyze the semiconductor integrated circuit device in the state of a semiconductor wafer forming the semiconductor integrated circuit device therein. In accordance with necessity, the system may be also formed such that this analysis is made only in the simplex case of the semiconductor integrated circuit device. Further, conversely, the system may be also formed such that this analysis is made only in the state of the semiconductor wafer forming the semiconductor integrated circuit device therein.

The process electron beam test system 10 has an electron beam prober 13, a dedicated analysis LSI tester 14 for operating a device connected to this electron beam prober 13, a control personal computer 17 for controlling operations of the electron beam prober 13 and the dedicated analysis LSI tester 14, a prober controller 50 for the electron beam prober, and a prober control personal computer 52 for controlling an operation of the prober controller 50.

The electron beam prober 13 has first and second mirror bodies 11, 12. Thermal W-Guns 15, 16 for irradiating the electron beam are arranged on the respective upper sides of the first and second mirror bodies 11, 12. Analytical grids 18, 19 for observing potential distribution and measuring a waveform are arranged on the respective lower sides of the first and second mirror bodies 11, 12.

An X-Y moving common stage 20 located below the first and second mirror bodies 11, 12 are arranged within the electron beam prober 13. In this stage 20, a fixed stage 21 located below the first mirror 11 is arranged and an X-Y movable stage 22 located below the second mirror body 12 is arranged.

A non-defective semiconductor integrated circuit device for comparison is placed on the fixed stage 21. A (defective) semiconductor integrated circuit device for measurement is placed on the X-Y movable stage 22. The non-defective and the defective may be reversely placed.

In accordance with necessity, the semiconductor wafer forming the non-defective semiconductor integrated circuit device therein may be placed on the fixed stage 21, and the semiconductor wafer forming the defective semiconductor integrated circuit device therein may be also placed on the X-Y movable stage 22, and these semiconductor wafers may be also operated by the LSI tester 14 similarly to the above case.

A secondary electron detector 23 is arranged in the vicinity of the fixed stage 21, and a secondary electron detector 24 is arranged in the vicinity of the X-Y movable stage 22.

The semiconductor integrated circuit device for measurement and the non-defective semiconductor integrated circuit device are respectively connected to the dedicated analysis LSI tester 14.

The dedicated analysis LSI tester 14 operates the non-defective/defective semiconductor integrated circuit devices. Concretely, these semiconductor integrated circuit devices are operated by supplying a test pattern signal shown in FIG. 8 and a voltage VDD from a direct current power source to the semiconductor integrated circuit device as an object.

At this time, the supplied voltage of the direct current power source is set to the power potential VDD. In addition, the supplied test pattern signal is supplied as a combination (a combination of high and low signals in voltage) of plural signals from each input terminal in synchronization with a clock signal. Here, a case in which the test pattern signal is sequentially supplied as a combination of four signal waveforms is exemplified.

In the semiconductor integrated circuit device, no high speed clock is required when fault and breakdown caused by process results are analyzed. Therefore, a low speed clock is used in the tester 14 of the embodiment. Further, since no high timing accuracy is required in the signal waveform, the tester 14 of this embodiment is formed as a tester for only a process defect. As this result, the system of this embodiment is simply constructed and cheaply manufactured.

The non-defective semiconductor integrated circuit device is prepared and is placed on the fixed stage 21. The defective semiconductor integrated circuit device as an analysis object is also prepared and is placed on the X-Y movable stage 22. These semiconductor integrated circuit devices are connected to the dedicated analysis LSI tester 14, and are operated by this LSI tester 14 as mentioned above.

Frame-scan irradiation of electron beam is performed to the operating semiconductor integrated circuit device by the thermal W-Guns 15, 16. A secondary electron from the semiconductor integrated circuit device is detected by the secondary electron detectors 23, 24 through the analytical grids 18, 19, and potential contrast is obtained. The non-defective and defective potential contrasts are compared with each other in real time by using the electron beam prober having the first and second mirror bodies. Thus, the defective semiconductor integrated circuit device can be analyzed.

As mentioned above, A/D converters 30, 31 and frame memories 32, 33 are arranged in the prober controller 50 of this embodiment to obtain potential contrast and generate a potential contrast image. A potential contrast signal detected by the secondary electron detectors 23, 24 is converted to a digital signal by the corresponding A/D converters 30, 31, and are written to the frame memories 32, 33. At this time, the prober control personal computer 52 and the prober controller 50 function as an electron beam control section for controlling the electron beam irradiation to the semiconductor integrated circuit device using the thermal W-Guns 15, 16 and the analytical grids 18, 19, and also function as a contrast image generating section together with the secondary electron detectors 23, 24, the A/D converters 30, 31 and the frame memories 32, 33.

2. Hold and Image Taking

Figure 2:
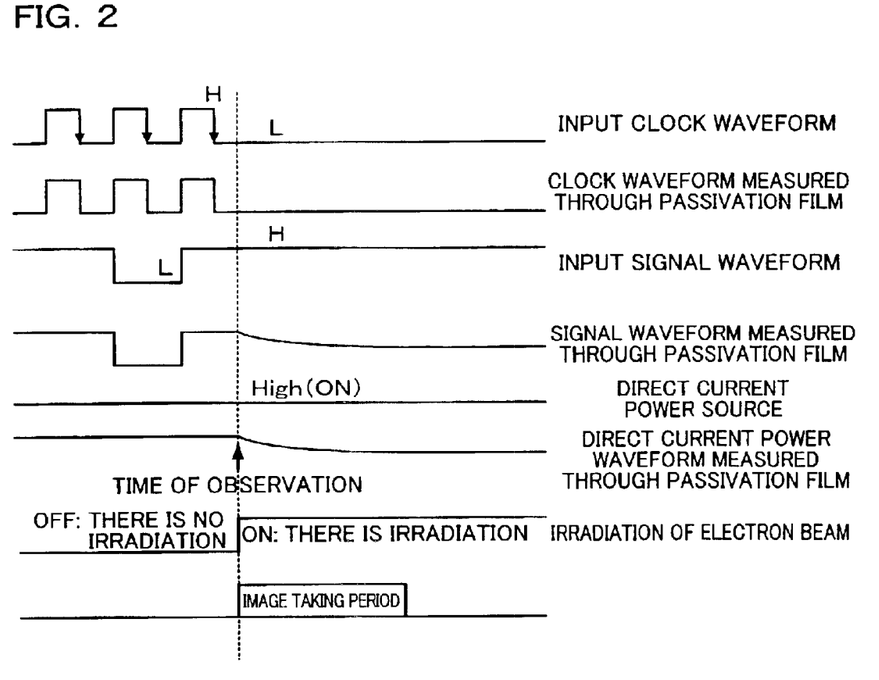
FIG. 2 shows examples of a clock waveform of wiring, a clock waveform through a passivation film, an input signal waveform, an input signal waveform through a passivation film, a power waveform, and a power waveform through a passivation film.

FIG. 2 shows a concrete example of each waveform in the semiconductor integrated circuit device. Here, FIG. 2 shows one example of a clock waveform of wiring, a clock waveform through the passivation film, an input signal waveform, an input signal waveform through the passivation film, a direct current power waveform, and a direct current power waveform through the passivation film. Further, this figure shows one example of the timing of electron beam irradiation and the timing of obtaining of the potential contrast image set in connection with each of the above waveforms.

The test pattern signal of the same type is supplied to each of the non-defective and defective semiconductor integrated circuit devices, and each of the non-defective and defective semiconductor integrated circuit devices is operated in a state in which the voltage of a direct current power source is supplied.

As shown in FIG. 2, the test pattern signal is held at a desired time (when a desired test pattern signal is inputted). The frame scan irradiation of the electron beam with respect to the semiconductor integrated circuit device is started in response to this hold (e.g., simultaneously with this hold, or just after this hold). Here, before the test pattern signal is held, electron beam irradiation is not started, but electron beam irradiation is started simultaneously with the hold of the test pattern signal. The surface of the semiconductor integrated circuit device is charged by the electron beam irradiation. Thus, the potential (e.g., high level) of each signal line can be detected as a signal of a given charging waveform through the passivation film.

In the system of the embodiment, the image of the semiconductor integrated circuit device is taken in synchronization with the frame scan irradiation of this electron beam. The frame scan for the image taking of this potential contrast is preferably constructed such that this frame scan is perfectly performed in synchronization with the frame scan of the above electron beam. Thus, it is possible to obtain the potential contrast including sufficient potential information.

Figures 3A, 3B, 3D:
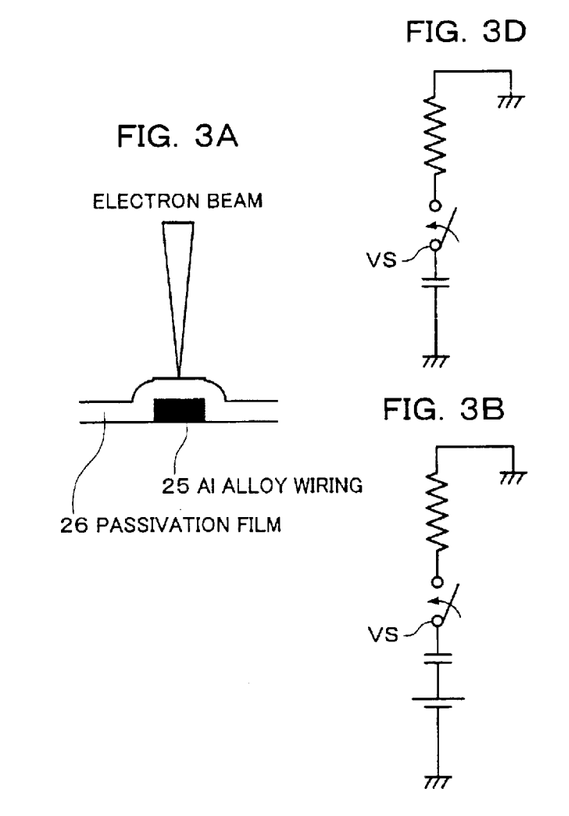
FIG. 3A is a sectional view showing part of a semiconductor integrated circuit device for obtaining potential contrast.
FIGS. 3B and 3D are equivalent circuit diagrams of the semiconductor integrated circuit device of FIG. 3A.
Figure 3C:
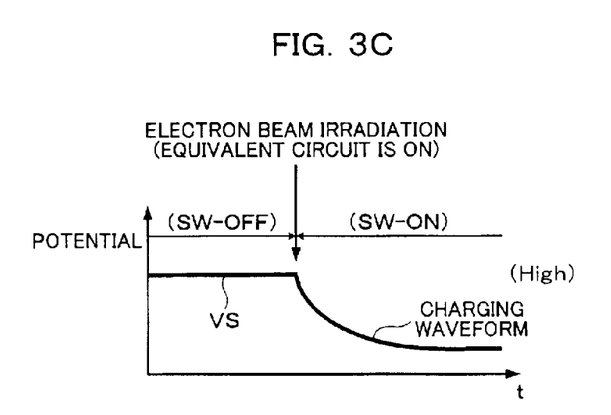
FIGS. 3C and 3E show waveforms generated on a surface of the passivation film of FIG. 3A.
Figure 3E:
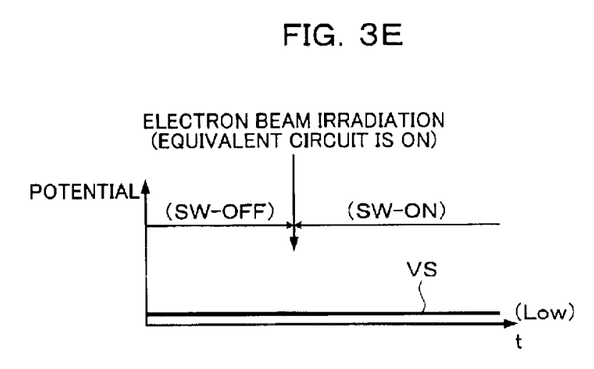

FIG. 3 explains the mechanism of potential contrast generation.

FIG. 3A is a sectional view showing part of the semiconductor integrated circuit device for obtaining the potential contrast. As shown in this figure, a passivation film (insulating film) 26 is formed on an Al alloy wiring 25.

First, in a state in which the test pattern signal at the high level is supplied to the Al alloy wiring 25, it is assumed that the test pattern signal is held.

FIG. 3B is an equivalent circuit diagram of the semiconductor integrated circuit device in this state. FIG. 3C is a view showing the waveform of a surface potential Vs of the passivation film 26 in this state.

A state in which the signal at the high level is supplied to the Al alloy wiring 25 is equivalent to the turning-off state of a switch shown in FIG. 3B. In this state, the passivation film 26 is in a state charged to a plus potential. Therefore, the surface potential Vs of the passivation film 26 is held in a high state as it is as shown in FIG. 3C.

The electron beam frame-scan irradiation is performed to this passivation film 26 by the thermal W-Guns 15, 16 shown in FIG. 1. When this electron beam irradiation is performed, electrons are injected into the passivation film 26, and the passivation film 26 is charged to a minus potential side. The irradiation of this electron beam is equivalent to turning-on of the switch and the start of charging on the minus potential side in FIG. 3B. Thus, the surface potential Vs of the passivation film 26 is observed as a charging waveform directed to the minus potential side as shown by a dotted chain line in FIG. 3C.

A case in which the pattern signal at a low level is supplied to the Al alloy wiring 25 shown in FIG. 3A is next assumed. FIG. 3D is an equivalent circuit diagram of the semiconductor integrated circuit device in this state. FIG. 3E shows the surface potential Vs of the passivation film 26 in this state.

In a state in which the test pattern signal at the low level is held, the surface potential Vs of the passivation film 26 is observed as the potential at the low level as shown by a solid line in FIG. 3E. The electron beam frame-scan irradiation is performed to this passivation film 26. The irradiation of this electron beam is equivalent to the turning-on of a switch shown in FIG. 3D, but the potential of the Al alloy wiring 25 is at the low level and the passivation film 26 is already charged to the minus potential. Therefore, no surface potential Vs of the passivation film 26 is changed at the low level as it is if the electron beam irradiation is done.

Thus, in the system of this embodiment, when the test pattern signal supplied to the semiconductor integrated circuit device is held at the desired time and the electron beam frame-scan irradiation is performed for this passivation film 26, the surface potential Vs of the passivation film 26 on the Al alloy wiring 25 supplying the signal at the low level thereto is not changed and is detected as a signal at the low level. However, the surface potential Vs of the passivation film 26 on the Al alloy wiring 25 supplying a signal at the high level thereto is observed as a charging waveform to the minus potential direction shown in FIG. 3C. If the signal supplied to the Al alloy wiring 25 is a signal at the high level, this charging waveform is reliably generated even when this supplied signal is a DC signal and a high level signal such as a signal having no potential change before the time of observation.

As mentioned above, in the system of this embodiment, it is possible to detect whether the potential of the signal of the Al alloy wiring 25 is high or low by observing the signal of the potential Vs through the passivation film 26 on the Al alloy wiring 25. In particular, the signal of the Al alloy wiring 25 can be reliably detected even when this signal is a DC signal unable to be observed in the conventional system or a signal such as a high level signal having no change in potential before the time of observation.

Concretely, a clock waveform and a signal waveform having the change in potential can be also obtained as the potential contrast. In addition to this, with respect to a direct current signal or a signal having no change in potential before and after the time of observation, the change in potential due to the charging waveform can be generated and it is possible to judge whether this potential level is high or low.

Further, in accordance with this embodiment, the potential of a signal line can be detected as a large charging signal through the passivation film 26. Therefore, the generation of a more preferable potential contrast image having improved potential contrast strength and S/N ratio can be realized by one-time observation for obtaining an image (or observation of a single shot phenomenon), by sequentially detecting the potential contrast data plural times during this charging period and integrating the detected potential contrast data in accordance with a predetermined rule to generate a potential contrast image.

Namely, in the conventional system, it is necessary to set plural shots in which the test pattern signal is repeatedly inputted to the semiconductor integrated circuit device, and the potential contrast is detected every time a desired test pattern signal is inputted. The plural potential contrasts obtained in this way were integrated and the final potential contrast image was generated. Accordingly, it takes time to generate the potential contrast image, and the potential contrast in each loop must be obtained while synchronization is taken in optimum timing in the looped test pattern. Therefore, the entire system was inevitably complicated and expensive, and such matters became an inducement causing an analysis error. Further, a defective phenomenon having no repeatability could not be analyzed in the conventional system.

In contrast to this, according to this embodiment, it is possible to implement a system which can simply and reliably obtain potential information in a single shot through a passivation film of a semiconductor integrated circuit device by observation of a single phenomenon that is a charging, as mentioned above. Accordingly, in the system of this embodiment, the potential contrast image can be generated for a short time, and this system can be simply constructed and cheaply manufactured. Further, it is also possible to analyze the defective phenomenon having no repeatability, which cannot be analyzed in the conventional system. Furthermore, an analytic error is reduced in comparison with the conventional system so that analytic accuracy can be raised.

In particular, in this embodiment, since the potential contrast is detected plural times during a charging period, it is possible to obtain the potential contrast image having a higher S/N ratio and a sufficient potential contrast strength.

In the generation of the above potential contrast image, it is preferable to set an integration ratio of the first detected potential contrast larger than that of the subsequently detected potential contrast.

Thus, an image storing ratio of the potential contrasts taken into the frame memory plural times can be optimized, and it is possible to generate the potential contrast image in which the potential contrast strength and the S/N ratio are further optimized.

Further, in the system of this embodiment, it is preferable to generate a trigger signal after the start of the hold of the supplied test pattern signal and determine the start time of the electron beam irradiation and the potential contrast detection.

In this configuration, it is sufficient to set the start time of the electron beam irradiation and the potential contrast detection only once. Thereafter, it is not necessary to reset the start time of the electron beam irradiation or the potential contrast detection if the type of the semiconductor integrated circuit device which is an analysis object is changed, or if the input timing of a desired test pattern signal is changed. Accordingly, the entire system is very simply treated and a preparing time of analysis is greatly shortened and a rapid analysis can be implemented.

In this embodiment, the non-defective and defective potential contrasts can be compared with each other in real time by using the electron beam prober having the first and second mirror bodies so that the analytic time can be greatly shortened. In contrast to this, it was necessary to replace and measure the non-defective and the defective in the conventional electron beam test system.

Further, in the embodiment, the two mirror bodies 11, 12 are used, but the system is reduced in cost by reducing manufacture cost of the individual mirror bodies and further setting the operating speed of the dedicated analysis LSI tester to a low speed. Therefore, the reduction in cost of the entire system can be realized. The conventional electron beam test system is very expensive, but low cost is realized in the process electron beam test system in this embodiment.

Namely, the process electron beam test system in this embodiment is a dedicated electron beam test system for analyzing fault or breakdown caused by a process defect. Accordingly, it is not necessary to cope with a speed margin defect often caused by a faulty design. Further, whether a potential is high or low can be determined even for a signal similar to a DC signal having no potential change. Therefore, since it can be unnecessary to arrange a waveform measuring function which was provided with the conventional electron beam tester, it is unnecessary to arrange a beam blanker-waveform measuring unit for measuring a high speed waveform. Further, it is also unnecessary to arrange the analytical grid when the potential contrast is obtained by utilizing a first kind local electric field effect. Further, since it is not necessary to change the electron beam to a pulse, it is not necessary to use the FE-Gun of high brightness so that no high degree low vacuum plant ( such as turbo molecular pump or ion pump) for this FE-Gun is also required. Accordingly, low cost can be realized as the entire system.

The operating effects of the system of this embodiment explained above, particularly, the system of this embodiment able to realize the image obtaining of a single shot are summarized as follows.

a: It is possible to observe the defective phenomenon having no repeatability.

b: It is very easy to set and operate the LSI tester since no test pattern signal is looped.

c: As a result of the above b, analysis can be made even when an operator knows little about operation of the LSI tester.

d: As a result of the above b, an analysis preparation period is shortened, and an analytic speed can be improved.

e: As a result of the above b, the analysis preparing period is reduced and analytic accuracy can be raised.

3. Concrete Example of the System of the Embodiment

The electron beam test system in this embodiment will next be explained in more detail.

3.1 Frame Scan

Figure 6:
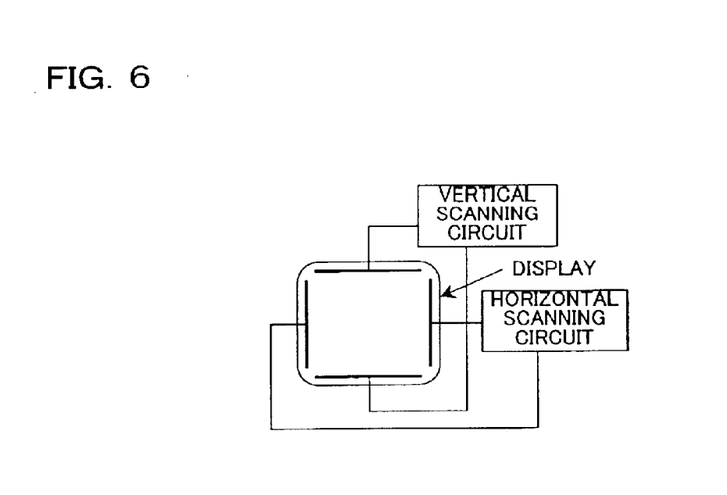
FIG. 6 is a diagram for illustrating frame scan for taking an image.
Figure 7:
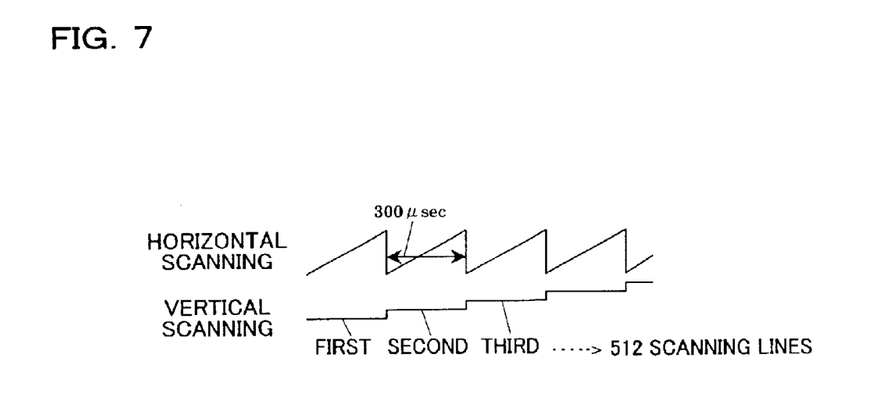
FIG. 7 is a diagram for illustrating horizontal and vertical scans.

First, the frame scan for obtaining the potential contrast will be described. FIG. 6 shows a display and its electrostatic deflection plate. FIG. 7 shows a saw-tooth-wave of horizontal scanning and a stepped wave of vertical scanning.

When a first saw-tooth-wave is applied to the left-hand and right-hand deflection plates of the display by a horizontal scanning circuit, a scanning line is scanned from left to right and is again returned to the original position. In a state in which one scanning line is transversally scanned to a display uppermost portion, a time required for the scanning is e.g., 300 $\mu$sec.

When a second saw-tooth-wave is applied, a (second) signal advanced by one step with respect to the stepped wave of the vertical scanning is emitted from a vertical scanning circuit. The second scanning line is scanned to a position moved by one step on the lower side from the first scanning line.

In a moment in which one scanning line is scanned from left to right by one saw-tooth-wave and is again retuned to the original position, its detailed position accurately becomes a position moved by one step to the lower side from the first scanning line. For example, the vertical scanning line is stepped waves of 512 steps. Thus, the 512 scanning lines are scanned so that one screen (one frame) is constructed.

In this case, time required to draw for one frame is:

$$300\ \mu\text{sec.} \times 512 = 153.6\ \text{msec.}$$

In this embodiment, the above frame scan of the display is perfectly performed in synchronization with the frame scan irradiation of a primary electron beam performed with respect to the surface of a sample (LSI chip) within the electron beam prober.

The horizontal scanning is shown by the saw-tooth-wave, but is shown by a stepped wave if it is digital scan. The stepped wave of the vertical scanning is shown by a saw-tooth-shape in the subsequent explanatory view.

3.2 Obtaining Potential Contrast

Figure 8:
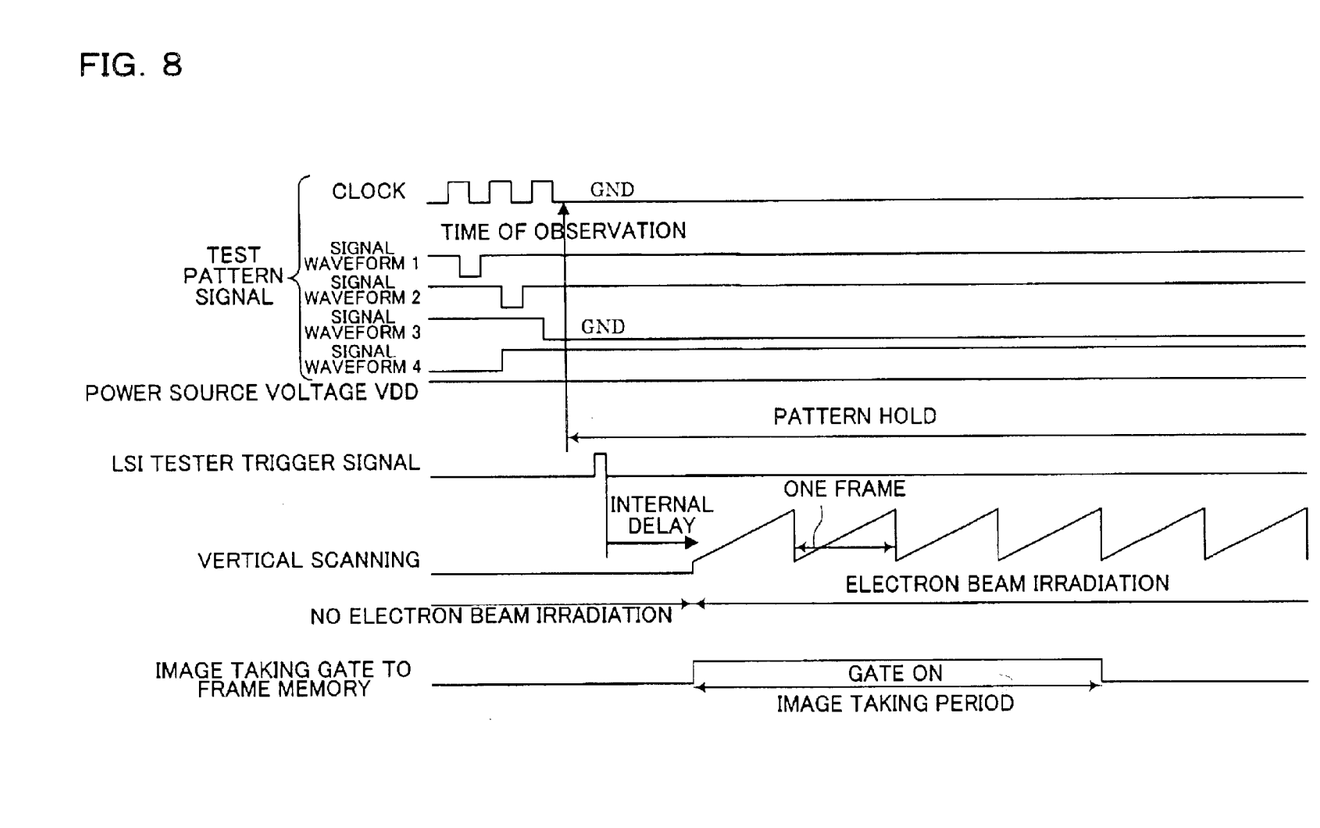
FIG. 8 is a timing chart showing a test pattern signal, hold of the test pattern signal and timing of the image taking.

In the system of this embodiment, the test pattern signal as shown in FIG. 8 is sequentially inputted in synchronization with a clock with respect to a sample (LSI chip) , and this test pattern signal is held when a desired test pattern signal is supplied. With respect to the sample (LSI chip) in which the test pattern signal is held, the frame scan irradiation of the electron beam is then started, and a potential image of the sample (LSI chip) is taken in a predetermined period just after this frame scan is started.

As shown in FIG. 8, in the system of this embodiment, a trigger signal used to start the electron beam irradiation and the image taking is supplied from the LSI tester 14 to the prober controller 50 after the input of a desired test pattern signal.

The prober controller 50 recognizes that the hold of the test pattern signal is started by the input of this trigger signal. The prober controller 50 then starts the irradiation of the electron beam and the image taking in the predetermined timing.

In the example shown in this figure, a taking situation of the image of four frames is shown. The potential contrast image taken into the frame memory is constructed by only first four frames. Since the condition from the hold of the test pattern to the image taking is fixed, there is an advantage in that it is not necessary to change the setting even when a clock rate, etc. are changed by changing the timing to be observed and an analytic object product kind (product kind of the LSI chip).

A procedure for obtaining the potential contrast will next be explained on the basis of FIG. 8.

Figure 9A:
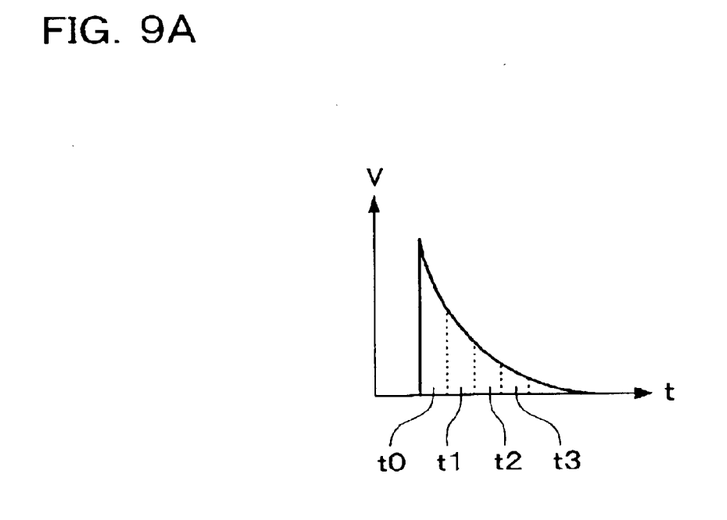
FIG. 9A is a graph showing the timing of image taking.

As shown in FIG. 9A, the potential contrast through the passivation film is changed as a charging waveform.

In this figure, the axis of ordinate shows V (voltage), and the axis of abscissa shows t (time).

Figure 9B:
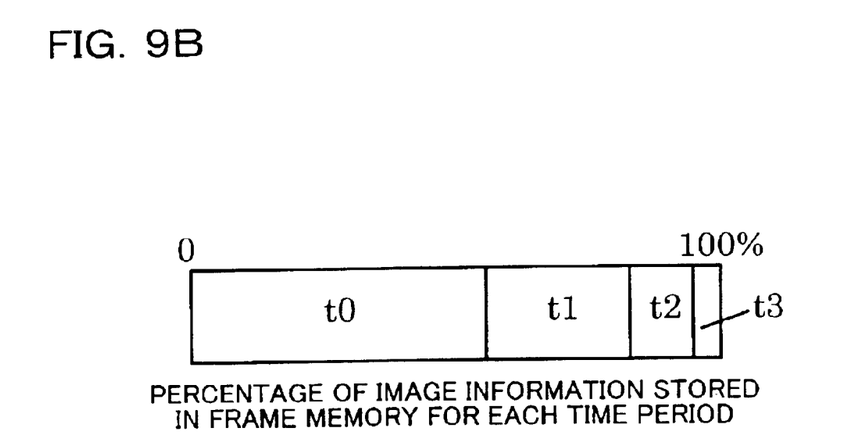
FIG. 9B is a diagram showing the processing for integrating a plurality of potential contrast images.

An image signal obtained at t=0 providing large V(t) is stored to the frame memory in a largest ratio to more effectively obtain potential information having such a behavior and realize observation of a single shot phenomenon (or one-time observation for obtaining an image). Thereafter, the integration of the image is advanced while the ratio of the image signal stored to the frame memory is gradually reduced in accordance with the magnitude of V(t). If the time is divided into four time periods t0 to t3 with respect to the charging waveform of FIG. 9A, for example, the percentage of image stored into the frame memory for each time period is as shown in FIG. 9B.

Thus, the potential contrast can be effectively obtained while the S/N of the image is secured, by changing the ratio of the image signal stored in the frame memory in accordance with the strength of the potential contrast.

Thus, in the system of this embodiment, images are sequentially taken a plurality of times during the charging period of potential contrast. The integration ratio of the first-taken potential contrast is set to be greater than that of the subsequently taken potential contrast, and the potential contrast image is generated. Thus, the ratio of image stored in the frame memory for each time period can be optimized, and it is possible to generate a preferable potential contrast image having improved potential contrast strength and S/N ratio.

Note that the present invention is not limited to the above embodiments and various modifications can be made.

What is claimed is:

1. An electron beam test system which obtains potential contrast data for analysis by irradiating electron beam to a semiconductor integrated circuit device which is an analysis object, the electron beam test system comprising:

a tester which supplies a test pattern signal for analysis to the semiconductor integrated circuit device, and holds the supplied test pattern signal at a given time;

an electron gun which irradiates electron beam to the semiconductor integrated circuit device in response to the hold of the test pattern signal; and a detector which detects the potential contrast data of the semiconductor integrated circuit device which is irradiated with electron beam, the electron beam irradiation to the semiconductor integrated circuit being a single shot during the entire hold of the test pattern.

2. The electron beam test system as defined in claim 1, further comprising:

an analytical grid for observing potential distribution, disposed between the electron gun and the semiconductor integrated circuit device.

3. The electron beam test system as defined in claim 2, further comprising:

a horizontally movable stage on which is mounted the semiconductor integrated circuit device which is an analysis object.

4. The electron beam test system as defined in claim 1, further comprising:

a beam control section which performs the electron beam irradiation as frame scan irradiation to the semiconductor integrated circuit device, at the same time with or after the hold of the supplied test pattern signal.

5. The electron beam test system as defined in claim 1, frame scan for the electron beam irradiation being performed in synchronization with frame scan for the potential contrast data detection.

6. The electron beam test system as defined in claim 1, the potential contrast data detection being sequentially performed two or more times in synchronization with the electron beam irradiation, and a potential contrast image being generated by integrating the detected potential contrast data in accordance with a given rule.

7. The electron beam test system as defined in claim 6, the potential contrast image being generated by setting the integration ratio of the first detected potential contrast data to be greater than the integration ratio of the subsequently detected potential contrast data.

8. The electron beam test system as defined in claim 1, start time of the electron beam irradiation and start time of the potential contrast data detection being determined based on the start time of the hold of the supplied test pattern signal.

9. The electron beam test system as defined in claim 8, a trigger signal being generated in response to the hold of the supplied test pattern signal, and the start time of the electron beam irradiation and the start time of the potential contrast data detection being determined based on the trigger signal.

10. An electron beam test system which obtains potential contrast data for analysis by irradiating electron beam to a semiconductor integrated circuit device which is an analysis object, the electron beam test system comprising:

a first stage on which is mounted the semiconductor integrated circuit device which is an analysis object;

a second stage on which is mounted a non-defective semiconductor integrated circuit device for comparison with the semiconductor integrated circuit device which is an analysis object;

a tester which supplies a test pattern signal for analysis to the semiconductor integrated circuit device which is an analysis object and the non-defective semiconductor integrated circuit device, and holds the supplied test pattern signal at a given time for each of the semiconductor integrated circuit device which is an analysis object and the non-defective semiconductor integrated circuit device;

a first electron gun which irradiates electron beam to the semiconductor integrated circuit device which is an analysis object in response to the hold of the test pattern signal supplied to the semiconductor integrated circuit device which is an analysis object;

a second electron gun which irradiates electron beam to the non-defective semiconductor integrated circuit device in response to the hold of the test pattern signal supplied to the non-defective semiconductor integrated circuit device;

a first detector which detects the potential contrast data of the semiconductor integrated circuit device as an analysis object which is irradiated with electron beam; and a second detector which detects the potential contrast data of the non-defective semiconductor integrated circuit device which is irradiated with electron beam.

11. The electron beam test system as defined in claim 10, further comprising:

a first analytical grid for observing potential distribution, disposed between the first electron gun and the first stage; and a second analytical grid for observing potential distribution, disposed between the second electron gun and the second stage.

12. The electron beam test system as defined in claim 10, further comprising:

a beam control section which performs the electron beam irradiation as frame scan irradiation to the semiconductor integrated circuit device which is an analysis object and the non-defective semiconductor integrated circuit device, at the same time with or after the hold of the supplied test pattern signal.

13. The electron beam test system as defined in claim 10, frame scan for the electron beam irradiation being performed in synchronization with frame scan for the potential contrast data detection.

14. The electron beam test system as defined in claim 10, the potential contrast data detection being sequentially performed two or more times in synchronization with the electron beam irradiation, and a potential contrast image being generated by integrating the detected potential contrast data in accordance with a given rule.

15. The electron beam test system as defined in claim 14, the potential contrast image being generated by setting the integration ratio of the first detected potential contrast data to be greater than the integration ratio of the subsequently detected potential contrast data.

16. The electron beam test system as defined in claim 10, start time of the electron beam irradiation and start time of the potential contrast data detection being determined based on the start time of the hold of the supplied test pattern signal.

17. The electron beam test system as defined in claim 16, a trigger signal being generated in response to the hold of the supplied test pattern signal, and the start time of the electron beam irradiation and the start time of the potential contrast data detection are determined based on the trigger signal.

18. An electron beam test system which obtains potential contrast data by irradiating electron beam to a semiconductor integrated circuit device which is an analysis object, the electron beam test system comprising:

a test pattern signal supplied to the semiconductor integrated circuit device is held at a given time;

electron beam irradiation to the semiconductor integrated circuit device is started at the same time with or after the hold of the test pattern signal; and the potential contrast data of the semiconductor integrated circuit device which is irradiated with electron beam is detected, the electron beam irradiation to the semiconductor integrated circuit being a single shot during the entire hold of the test pattern.

19. The electron beam test system as defined in claim 18, further comprising:

a beam control section which performs the electron beam irradiation as frame scan irradiation to the semiconductor integrated circuit device, at the same time with or after the hold of the supplied test pattern signal.

20. The electron beam test system as defined in claim 18, frame scan for the electron beam irradiation being performed in synchronization with frame scan for the potential contrast data detection.

21. The electron beam test system as defined in claim 18, the potential contrast data detection being sequentially performed two or more times in synchronization with the electron beam irradiation, and a potential contrast image being generated by integrating the detected potential contrast data in accordance with a given rule.

22. The electron beam test system as defined in claim 21, the potential contrast image being generated by setting the integration ratio of the first detected potential contrast data to be greater than the integration ratio of the subsequently detected potential contrast data.

23. The electron beam test system as defined in claim 18, start time of the electron beam irradiation and start time of the potential contrast data detection being determined based on the start time of the hold of the supplied test pattern signal.

24. The electron beam test system as defined in claim 23, a trigger signal being generated in response to the hold of the supplied test pattern signal, and the start time of the electron beam irradiation and the start time of the potential contrast data detection are determined based on the trigger signal.

25. An electron beam test system which obtains potential contrast data from a semiconductor integrated circuit device which is an analysis object and a non-defective semiconductor integrated circuit device for comparison with the semiconductor integrated circuit device which is an analysis object, by irradiating electron beam to the semiconductor integrated circuit device which is an analysis object and the non-defective semiconductor integrated circuit device, the electron beam test system comprising:

a test pattern signal supplied to each of the semiconductor integrated circuit device which is an analysis object and the non-defective semiconductor integrated circuit device is held at a given time;

electron beam irradiation to each of the semiconductor integrated circuit device which is an analysis object and the non-defective semiconductor integrated circuit device is started at the same time with or after the hold of the test pattern signal; and the potential contrast data of each of the semiconductor integrated circuit device which is an analysis object and the non-defective semiconductor integrated circuit device which is irradiated with electron beam is detected, the electron beam irradiation to the semiconductor integrated circuit being a single shot during the entire hold of the test pattern.

26. The electron beam test system as defined in claim 25, further comprising:

a beam control section which performs the electron beam irradiation as frame scan irradiation to the semiconductor integrated circuit device which is an analysis object and the non-defective semiconductor integrated circuit device, at the same time with or after the hold of the supplied test pattern signal.

27. The electron beam test system as defined in claim 25, frame scan for the electron beam irradiation being performed in synchronization with frame scan for the potential contrast data detection.

28. The electron beam test system as defined in claim 25, the potential contrast data detection being sequentially performed two or more times in synchronization with the electron beam irradiation, and a potential contrast image being generated by integrating the detected potential contrast data in accordance with a given rule.

29. The electron beam test system as defined in claim 28, the potential contrast image being generated by setting the integration ratio of the first detected potential contrast data to be greater than the integration ratio of the subsequently detected potential contrast data.

30. The electron beam test system as defined in claim 25, start time of the electron beam irradiation and start time of the potential contrast data detection being determined based on the start time of the hold of the supplied test pattern signal.

31. The electron beam test system as defined in claim 30, a trigger signal being generated in response to the hold of the supplied test pattern signal, and the start time of the electron beam irradiation and the start time of the potential contrast data detection being determined based on the trigger signal.

32. An electron beam test method, comprising:

a test pattern signal supplied to a semiconductor integrated circuit device which is an analysis object is held at the desired time;

the semiconductor integrated circuit device is irradiated with electron beam in response to the hold of the test pattern signal; and a potential contrast image used to analyze fault or breakdown caused by a process defect is generated by detecting potential contrast data of the semiconductor integrated circuit device which is irradiated with electron beam, the electron beam irradiation to the semiconductor integrated circuit being a single shot during the entire hold of the test pattern.

33. The electron beam test method as defined in claim 32, the potential contrast data detection being sequentially performed two or more times in synchronization with the electron beam irradiation, and a potential contrast image being generated by integrating the detected potential contrast data in accordance with a given rule.

34. The electron beam test method as defined in claim 32, frame scan for the electron beam irradiation being performed in synchronization with frame scan for the potential contrast data detection.

35. An electron beam test method, comprising:

a test pattern signal supplied to each of a semiconductor integrated circuit device which is an analysis object and a non-defective semiconductor integrated circuit device is held at the desired time;

each of the semiconductor integrated circuit device which is an analysis object and the non-defective semiconductor integrated circuit device is irradiated with electron beam in response to the hold of the test pattern signal;

potential contrast images are generated by detecting potential contrast data of the semiconductor integrated circuit device and the non-defective semiconductor integrated circuit device which is irradiated with electron beam; and fault or breakdown caused by a process defect of the analysis object is analyzed by comparing the generated potential contrast images, the electron beam irradiation to the semiconductor integrated circuit being a single shot during the entire hold of the test pattern.

36. The electron beam test method as defined in claim 35, the potential contrast data detection being sequentially performed two or more times in synchronization with the electron beam irradiation, and a potential contrast image being generated by integrating the detected potential contrast data in accordance with a given rule.

37. The electron beam test method as defined in claim 35, frame scan for the electron beam irradiation being performed in synchronization with frame scan for the potential contrast data detection.

\* \* \* \* \*